(12) United States Patent
Dieguez-Campo et al.

(10) Patent No.: US 10,689,760 B2
(45) Date of Patent: Jun. 23, 2020

(54) DEPOSITION PLATFORM FOR FLEXIBLE SUBSTRATES AND METHOD OF OPERATION THEREOF

(71) Applicant: Applied Materials, Inc., Santa Clara, CA (US)

(72) Inventors: Jose Manuel Dieguez-Campo, Hanau (DE); Heike Landgraf, Bruchkobel (DE); Tobias Stolley, Oberursel (DE); Stefan Hein, Blankenbach (DE); Florian Ries, Westerngrund (DE); Morrison Neil, Buedingen (DE)

(73) Assignee: Applied Materials, Inc., Santa Clara, CA (US)

( * ) Notice: Subject to any disclaimer, the term of this patent is extended or adjusted under 35 U.S.C. 154(b) by 747 days.

(21) Appl. No.: 15/351,279

(22) Filed: Nov. 14, 2016

(65) Prior Publication Data

US 2017/0058404 A1    Mar. 2, 2017

Related U.S. Application Data

(62) Division of application No. 13/894,242, filed on May 14, 2013, now abandoned.

(30) Foreign Application Priority Data

Mar. 28, 2013    (EP) .................................... 13161697

(51) Int. Cl.
    *C23C 16/54*    (2006.01)
    *C23C 16/44*    (2006.01)
    (Continued)

(52) U.S. Cl.
    CPC .......... *C23C 16/545* (2013.01); *C23C 14/562* (2013.01); *C23C 16/44* (2013.01);
    (Continued)

(58) Field of Classification Search
    CPC ................ C23C 16/545; C23C 14/562; C23C 16/45519; C23C 16/509; C23C 16/44; C23C 16/4409
    See application file for complete search history.

(56) References Cited

U.S. PATENT DOCUMENTS

5,399,254 A    3/1995    Geisler et al.
5,529,631 A    6/1996    Yoshikawa et al.
(Continued)

FOREIGN PATENT DOCUMENTS

CN    102021539 A    4/2011
EP    1889947 A1    2/2008
(Continued)

OTHER PUBLICATIONS

Search Report in related application CN20140029903.0 dated Mar. 2, 2017.
(Continued)

*Primary Examiner* — Kambiz Zand
*Assistant Examiner* — Mirza Israr Javed
(74) *Attorney, Agent, or Firm* — Patterson + Sheridan, LLP

(57) ABSTRACT

An apparatus for processing a flexible substrate is provided including a vacuum chamber having a first chamber portion, second chamber portion and third chamber portion. The apparatus further includes an unwinding shaft supporting the flexible substrate to be processed and a winding shaft supporting the flexible substrate after processing, wherein the unwinding shaft and the winding shaft are disposed in the first chamber portion, a first wall separating the first chamber portion from the second chamber portion, wherein the first wall is inclined with respect to a vertical and horizontal orientation, a coating drum having a first portion disposed in the second chamber portion and a second portion
(Continued)

disposed in the third chamber portion, and a plurality of processing stations disposed at least partially in the third chamber portion, wherein a majority of the plurality of the processing stations are disposed below a rotational axis of the coating drum.

7 Claims, 6 Drawing Sheets

(51) Int. Cl.
    *C23C 16/509*     (2006.01)
    *C23C 16/455*     (2006.01)
    *C23C 14/56*     (2006.01)

(52) U.S. Cl.
    CPC .... *C23C 16/4409* (2013.01); *C23C 16/45519* (2013.01); *C23C 16/509* (2013.01)

(56) References Cited

U.S. PATENT DOCUMENTS

| | | | |
|---|---|---|---|
| 6,096,389 A | 8/2000 | Kanai | |
| 6,188,044 B1 | 2/2001 | Lee et al. | |
| 7,025,833 B2 | 4/2006 | Madocks | |
| 7,462,244 B2 | 12/2008 | Utsugi et al. | |
| 8,697,582 B2 * | 4/2014 | Okazaki | H01L 21/02532 |
| | | | 118/724 |
| 2006/0159844 A1 * | 7/2006 | Moriwaki | C23C 14/562 |
| | | | 427/127 |
| 2006/0192964 A1 | 8/2006 | Lotz et al. | |
| 2008/0102222 A1 * | 5/2008 | Fujinawa | C23C 16/45578 |
| | | | 427/569 |
| 2009/0200269 A1 | 8/2009 | Kadkhodayan et al. | |
| 2010/0196591 A1 | 8/2010 | Hein et al. | |
| 2010/0243167 A1 | 9/2010 | Hayashi | |
| 2011/0033638 A1 | 2/2011 | Ponnekanti et al. | |
| 2011/0064890 A1 * | 3/2011 | Fujinami | C23C 16/44 |
| | | | 427/569 |
| 2011/0139072 A1 | 6/2011 | Tamagaki et al. | |
| 2011/0180478 A1 | 7/2011 | Shah et al. | |
| 2011/0281029 A1 * | 11/2011 | Honda | C23C 14/042 |
| | | | 427/255.7 |
| 2012/0043198 A1 | 2/2012 | Yamazaki | |
| 2012/0301615 A1 * | 11/2012 | Honda | C23C 14/541 |
| | | | 427/255.5 |
| 2014/0311410 A1 * | 10/2014 | Yang | C23C 16/4405 |
| | | | 118/719 |

FOREIGN PATENT DOCUMENTS

| | | |
|---|---|---|
| EP | 2113310 A1 | 11/2009 |
| EP | 2762607 | 8/2014 |
| EP | 2762608 | 8/2014 |
| JP | 2000239849 A | 9/2000 |
| JP | 2004095677 A | 3/2004 |

OTHER PUBLICATIONS

European Search Report in related application EP 10 174110 dated Oct. 29, 2010.
European Search Report dated Jul. 4, 2013 for EP 13 15 3501.
European Search Report dated Jul. 2, 2013 for EP 13 15 3493.

* cited by examiner

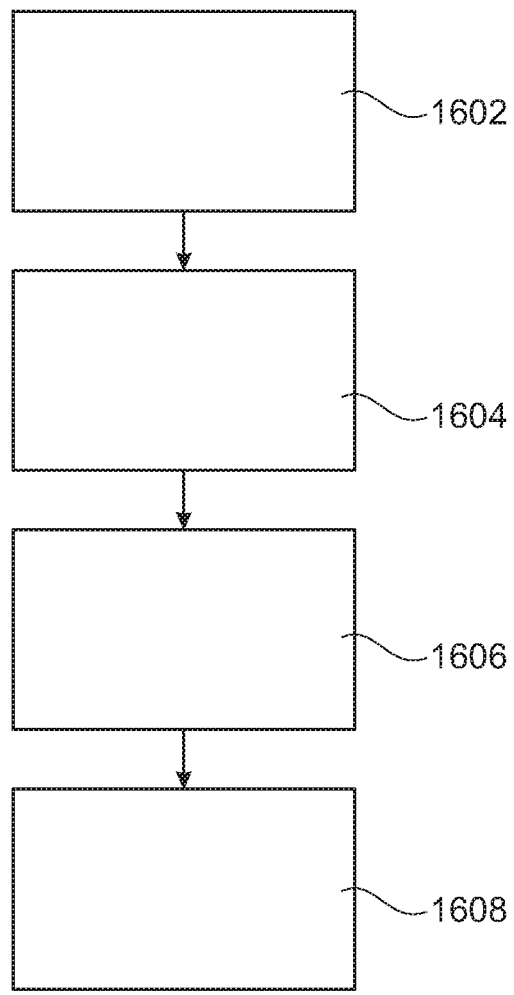

DEPOSITION PLATFORM FOR FLEXIBLE SUBSTRATES AND METHOD OF OPERATION THEREOF

CROSS-REFERENCE TO RELATED APPLICATIONS

This application is a divisional of U.S. patent application Ser. No. 13/894,242 filed on May 14, 2013, which claims benefit of European Patent Application 13161697.1 filed Mar. 28, 2013, which are both herein incorporated by reference.

TECHNICAL FIELD OF THE INVENTION

Embodiments of the present invention relate to thin-film processing apparatuses, particularly to deposition systems, and more particularly to roll-to-roll (R2R) deposition systems and methods for the operation thereof. Embodiments of the present invention particularly relate to apparatuses for processing flexible substrates and methods of depositing at least two layers on a substrate with a first deposition source and at least one second deposition source is provided.

BACKGROUND OF THE INVENTION

Processing of flexible substrates, such as plastic films or foils, is in high demand in the packaging industry, semiconductor industries and other industries. Processing may consist of coating of a flexible substrate with a desired material, such as a metal, in particular aluminum, semiconductors and dielectric materials, etching and other processing steps conducted on a substrate for the desired applications. Systems performing this task generally include a processing drum, e.g., a cylindrical roller, coupled to a processing system for transporting the substrate, and on which at least a portion of the substrate is processed. Roll-to-roll coating systems can, thereby, provide a high throughput system.

Typically, an evaporation process, such as a thermal evaporation process, can be utilized for depositing thin layers of metals which can be metallized onto flexible substrates. However, Roll-to-Roll deposition systems are also experiencing a strong increase in demand in the display industry and the photovoltaic (PV) industry. For example, touch panel elements, flexible displays, and flexible PV modules result in an increasing demand of depositing suitable layers in Roll-to-Roll coaters, particularly with low manufacturing costs. However, such devices typically have several layers, which are typically manufactured with CVD processes and particularly also PECVD processes.

The combination of several CVD, PECVD and/or PVD sources working with different gas mixtures and/or different working pressures faces the need of an excellent process gas separation to avoid cross contamination effects in the subsequent process steps and to ensure the long term process stability. Commonly, the deposition of complex thin film layer structures are performed subsequent in different R2R coaters, each one designed to the needs of the special deposition technique. However, this concept results in high costs of ownership (CoO) for the manufacturing equipment.

OLED displays have gained significant interest recently in display applications in view of their faster response times, larger viewing angles, higher contrast, lighter weight, lower power, and amenability to flexible substrates, as compared to liquid crystal displays (LCD). In addition to organic materials used in OLEDs, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel displays (FPD), electrically pumped organic lasers, and organic optical amplifiers.

Over the years, layers in display devices have evolved into multiple layers with each layer serving a different function. Depositing multiple layers onto multiple substrates may require multiple processing chambers. Transferring multiple substrates through multiple processing chambers may decrease substrate throughput. Therefore, there is a need in the art for an efficient method and apparatus for processing such OLED structures, semiconductor structures and other modern more sophisticated devices to ensure substrate throughput is maximized and substrate transferring is decreased.

SUMMARY OF THE INVENTION

In light of the above, an apparatus for processing flexible substrates and a method of depositing at least two layers on a substrate with a first deposition source and at least one second deposition source is provided. Further aspects, advantages, and features of the present invention are apparent from the dependent claims, the description, and the accompanying drawings.

According to one embodiment, an apparatus for processing a flexible substrate is provided. The apparatus includes a vacuum chamber having a first chamber portion, a second chamber portion and a third chamber portion, an unwinding shaft for supporting the flexible substrate to be processed and a winding shaft supporting the flexible substrate having the thin film deposited thereon, wherein the unwinding shaft and the winding shaft are arranged in the first chamber portion, at least one gap sluice for separating the first chamber portion from the second chamber portion, wherein the gap sluice is configured such that the flexible substrate can move there through and the gap sluice can be opened and closed for providing a vacuum seal, a coating drum having a rotation axis and a curved outer surface for guiding the substrate along the curved outer surface through a first vacuum processing region and at least one second vacuum processing region, wherein a first portion of the coating drum is provided in the second chamber portion and the remaining portion of the coating drum is provided in the third chamber portion, a first processing station corresponding to the first processing region and at least one second processing station corresponding to the at least one second vacuum processing region, wherein the first processing station and the second processing station each includes a flange portion for providing a vacuum connection. Further, the third chamber portion has a convex shaped chamber wall portion, wherein the third chamber portion has at least two openings provided therein, particularly wherein the at least two openings are essentially parallel to the convex shaped chamber wall portion; and wherein the first processing station and the at least one second processing station are configured to be received in the at least two openings, wherein the flange portions of the first processing station and the second processing station provide a vacuum tight connection with the third chamber portion.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 7 shows a flow chart illustrating methods for depositing a thin film on a substrate including separation gas inlet according to embodiments described herein.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

It is noted here that a flexible substrate or web as used within the embodiments described herein can typically be characterized in that it is bendable. The term "web" may be synonymously used with the term "strip" or the term "flexible substrate". For example, the web, as described in embodiments herein, may be a foil or another flexible substrate. However, as described in more detail below, the benefits of embodiments described herein may also be provided for non-flexible substrates or carriers of other inline-deposition systems. Yet, it is understood that particular benefit can be utilized for flexible substrates and applications for manufacturing devices on flexible substrates.

Embodiments described herein relate to apparatuses for processing a flexible substrate, e.g. for depositing a thin film on the flexible substrate. Thereby, as exemplarily shown in FIG. 1, the apparatus 100 includes a vacuum chamber 102. The vacuum chamber has a first chamber portion 102A, a second chamber portion 102B and a third chamber portion 102C. The first chamber portion 102A is configured as a winding/unwinding chamber and can be separated from the remaining portions of the chamber for exchange of the flexible substrate such that the remaining chamber portions 102B, 102C do not need to be vented for removing the processes flexible substrate and evacuated after the new substrate has been inserted. Thereby, the downtime of the apparatus can be reduced. Accordingly, the overall objective of increased throughput can be served.

Figure 1:
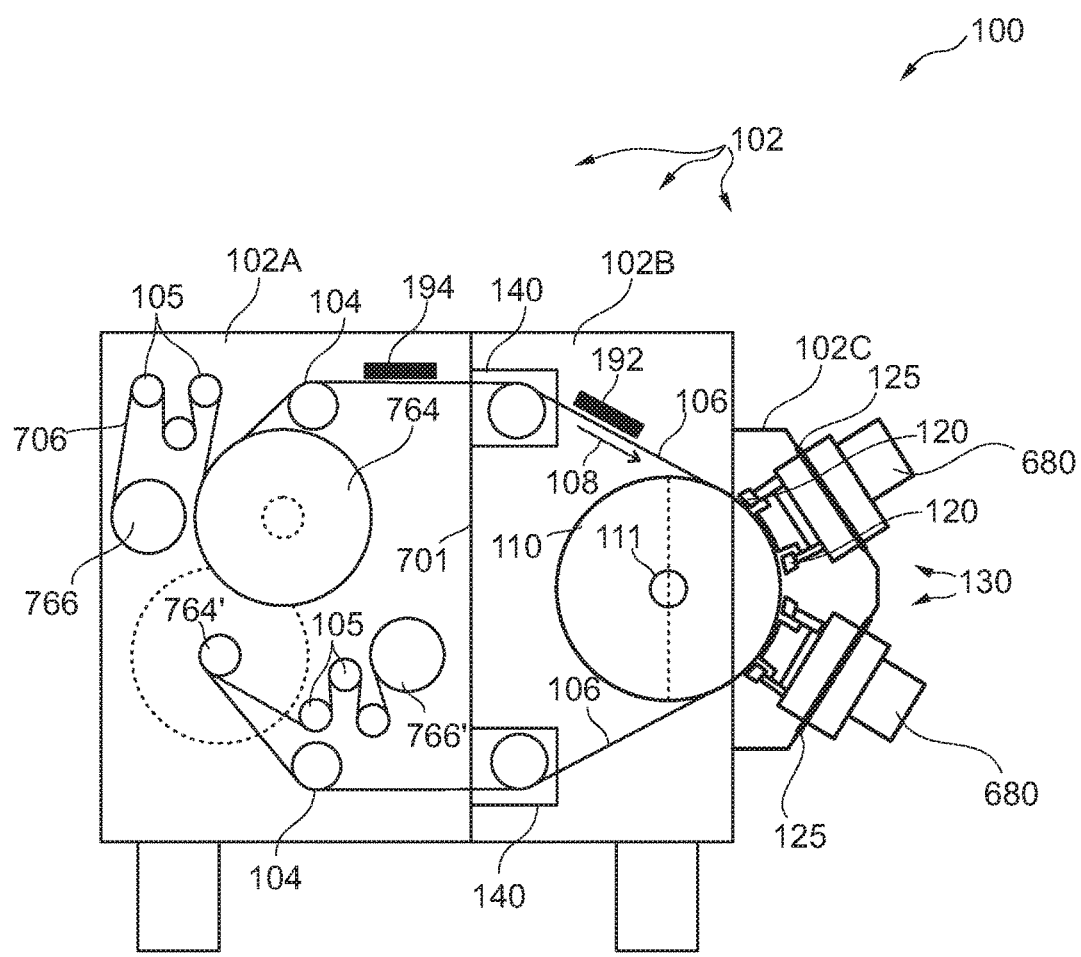
FIG. 1 shows a schematic view of a roll-to-roll deposition apparatus for depositing or coating the thin-film according to embodiments described herein.

The substrate is provided on a first roll 764 having a shaft, which is e.g. used for unwinding in FIG. 1. The substrate is wound on a second roll 764' having a shaft, which is e.g. used for winding in FIG. 1. However, it is understood that the substrate can also be guided through the apparatus 100 in reverse direction such that the shafts can be used for winding instead of unwinding and for unwinding instead of winding. Accordingly, the unwinding shaft for supporting the flexible substrate to be processed and the winding shaft supporting the flexible substrate having the processed thin film thereon are provided in the first chamber portion 102A. The flexible substrate 106 is provided on a first roll 764, e.g. having a winding shaft. According to some embodiments, which can be combined with other embodiments described herein, the flexible substrate to be processed can be provided on the roll 764 together with an interleaf 706. Thereby, the interleaf can be provided between adjacent layers of the flexible substrate such that direct contact of one layer of the flexible substrate with an adjacent layer of the flexible substrate on roll 764 can be omitted. According to typical embodiments, the substrate is guided via one, two or more rollers 104 from the roll 764 to the coating drum and from the coating drum to the second roll 764', e.g. having a winding shaft, on which the substrate is wound after processing thereof. After processing, a further interleaf can be provided from interleaf roll 766' between the layers of the flexible substrate 106, which is wound on to the roll 764'.

According to the embodiments described herein, at least one gap sluice 140 for separating the first chamber portion from the second chamber portion is provided at a separation wall 701. As shown in FIG. 1 typically two gap sluices are provided. The one or more gap sluices are configured such that the flexible substrate can move there through and the gap sluice can be opened and closed for providing a vacuum seal. According to typical embodiments, a gap sluice includes a roller for guiding the substrate, e.g. for redirecting the substrate movement by an angle of 10° or above. Further, an inflatable seal is provided that can be pressed against the roller of the gap sluice. The gap sluice is closed by inflating the seal and the first chamber portion 102A and the second chamber portion 102B are separated from each other in a vacuum tight manner. Thus, the first chamber portion 102A can be vented while the second chamber portion 102B can be maintained under technical vacuum.

According to a further alternative implementation, the gap sluice can also be provided without a roller. An inflatable seal can press the substrate against a flat sealing surface. Yet, also other means for selectively opening and closing gap sluice can be utilized wherein opening and closing, i.e. having an open substrate path and a vacuum seal, can be conducted while the substrate is inserted. The gap sluice for closing the vacuum seal while the substrate is inserted allows for particularly easy exchange of the substrate, as the substrate from the new roll can be attached to the substrate from the previous roll and the flexible substrate can be wound through the system while chamber portions 102B and 102C are evacuated by pulling the previous substrate with the new substrate attached thereto through the apparatus.

As further shown in FIG. 1, a coating drum 110 having a rotation axis 111 is provided in the apparatus. The coating drum has a curved outer surface for guiding the substrate along the curved outer surface. The substrate is thereby guided through a first vacuum processing region, e.g. of the upper processing station 130 in FIG. 1, and at least one second vacuum processing region, e.g. of the lower processing station 130 in FIG. 1. Even though it is often referred to herein to deposition stations as the processing stations 130, also other processing stations, like etch stations, heating stations, etc. can be provided along the curved surface of the coating drum 110.

According to embodiments described herein, a first portion of the coating drum, i.e. an area of the cross-section of the coating drum perpendicular to the rotation axis, is provided in the second chamber portion 102B and the remaining portion of the coating drum, i.e. an area of the cross-section of the coating drum perpendicular to the rotation axis, is provided in the third chamber portion 102C. As can be seen by the dotted line in FIG. 1, typically, the first portion is larger than the remaining portion, i.e. the axis 111 is provided in the second chamber portion 102B. Providing the axis 111 in the second chamber portion provides easier and, thus, more cost efficient design of the apparatus, which also serves CoO. For example, the ratio of the first portion of the coating drum and the remaining portion of the coating drum can be 1.1:1 or larger. Yet, from a mechanical point of view the axis might be moved towards the third chamber portion 102C to be slightly over the border from the second to the third portion without deteriorating the stability of the system too much. Accordingly the ration might also be 0.8:1 or larger.

According to embodiments described herein, the third chamber portion 102C has a convex shape wall portion. Thereby, convex is to be understood as either having a curved surface of the wall portion or having a plurality of flat surfaces adjacent to each other in order to provide for a convex shape of the plurality of surfaces. According to typical embodiments, the plurality of flat surfaces forming together the convex shape has the advantage that the below-mentioned vacuum flange connections can be provided at a flat surface, which is easier to manufacture. The easier manufacturing again reduces the costs of the equipment.

FIG. 1 shows a first processing station 130 corresponding to the first processing region and at a second processing station 130 corresponding to the second vacuum processing region. According to embodiments described herein, at least two processing stations are provided, wherein at least two processing stations include a flange portion 125 for providing a vacuum connection to the third chamber portion 102C. Typically, the third chamber portion has a convex shaped wall portion and at least two openings essentially parallel thereto, for example the at least two openings are provided within the convex shaped wall portion or in a protrusion extending from the convex shaped wall portion, i.e. an extension of the convex shaped wall portion protruding essentially radially outward with respect to the coating drum axis. The at least two processing stations are configured to be received in the at least two openings of the third chamber portion. Thereby, the flange portions 125 provide a vacuum tight connection with the convex shaped wall portion of the third chamber portion or with the protrusion extending from the convex shaped wall portion.

Accordingly, the processing stations can be inserted from outside of the convex shaped wall portion of the third chamber portion 103. On insertion, a vacuum flange can be connected and a vacuum region is provided in the third chamber portion. According to typical embodiments, the processing stations can be inserted in the openings along an essential radial direction with respect to the axis of the coating drum 110.

As described above, a portion of the processing stations 130 are thus provided in vacuum, i.e. within the third chamber portion and/or inside with respect to the flange. Another portion of the processing stations is provided outside of the region in which the vacuum in the vacuum chamber 102 is provided. This allows for an easy exchange of the processing stations and supply of consumption media like cooling fluid, gas, electric power etc. According to some implementations, at least the connection of the processing station to the match circuit 680 is provided outside the third chamber portion 102C and, thereby forms the above-mentioned another portion outside of the region. Further, the openings in the wall portion of the third chamber portion or in the protrusion extending from the convex shaped wall portion are typically shaped to have a predetermined shape and size. There is a standardized opening such that different processing stations with a flange configured to fit the standardized opening can be exchangeable utilized at different processing regions. This results in easier maintenance and increased flexibility of utilization of the apparatus 100. Again CoO can be reduced in light of the reduced downtime (easier maintenance) and in light of the flexible utilization. The latter results in the fact that different products can be manufactured on one apparatus such that an owner can switch between manufacturing of different products on the same processing apparatus 100.

According to yet further embodiments the distance of the curved outer surface of the coating drum 110 and the flange or the convex shape of the chamber can be from 10 mm to 500 mm. Thereby, the distance refers to the dimension from the coating drum surface to the inner wall or flange portion, which delimits the vacuum area of the chamber 102. Providing the convex shape and the dimensions mentioned above allow for a reduced chamber volume in the third chamber portion 102C. The reduced chamber volume in the third portion allows for easier gas separation and easier evacuation of processing zones. For example, the second chamber portion has a volume of the evacuatable region and the third chamber portion has a further volume of the further evacuatable region and the ratio of the volume to the further volume is at least 2:1, such as 3:1 to 6:1

According to yet further implementations, areas in the third chamber portion, which are not filled with a solid material can be filled with blocks of materials to reduce the area to be evacuated. For example, the second chamber portion has a volume of the evacuatable region and the third chamber portion has a further volume of the further evacuatable region and the ratio of the volume to the further volume is increased by volume reduction blocks to at least 7:1.

As described above, FIG. 1 shows a deposition apparatus 100. The deposition apparatus 100 includes a chamber 102, which can typically be provided such that the vacuum can be generated in the chamber. Thereby, various vacuum processing techniques, and particularly vacuum deposition techniques, can be used to process the substrate or to deposit the thin-film on the substrate. As shown in FIG. 1, and as referred to herein, the apparatus 100 is a roll-to-roll deposition apparatus, bearing a flexible substrate 106 being guided and processed. The flexible substrate 106 is guided in FIG. 1, as indicated by arrow 108, from the chamber portion 102A to the chamber portion 102B and further to the chamber portion 102C having the processing stations therein. The flexible substrate is directed by the rollers 104 to a coating drum 110 configured for supporting the substrate during processing and/or deposition. From the coating drum 110, the substrate 106 is guided to a further roller 104 and into chamber portions 102B and 102A, respectively.

The embodiment depicted in FIG. 1 includes two processing stations 130, such as two deposition sources. The deposition sources are provided in processing regions, wherein the substrate being supported by the coating drum is processed in the respective areas. Yet, it is to be understood that according to yet further embodiments, which can be combined with other embodiments described herein, two or more processing stations, e.g. deposition stations can be provided. For example, four, five, six, or even more, such as 8, 10 or 12 processing stations, e.g. deposition stations can be provided. The processing regions are separated from adjacent processing regions or further areas by gas separation units.

According to embodiments described herein, the processing stations and/or the gas separation unit 120, e.g. together with the processing station, is configured to have a varying position to adjust the distance from the coating drum 110. That is the processing stations and/or the gas separation unit can move in a radial direction with respect to the coating drum. The gas separation unit 120 typically includes a wall, which prevents gas in one processing region from entering a neighboring area, such as a neighboring processing region. An element of the gas separation unit provides the slit between the gas separation unit and the substrate 106 or the coating drum, respectively. Thereby, the element defines the length of the slit and the radial position of the element defines the width of the slit between the gas separation unit 120 and the substrate 106.

According to yet further embodiments, which can be combined with other embodiments described herein, the apparatus 100 can further include a pre-heating unit 194 to heat the flexible substrate. Thereby, a radiation heater an e-beam heater or any other element to heat the substrate prior to processing thereof can be provided. Further, additionally or alternatively a pre-treatment plasma source 192, e.g. an RF plasma source can be provided to treat the substrate with a plasma prior to entering the third chamber portion 102C. For example, the pre-treatment with a plasma can provide for a surface modification of the substrate surface to enhance film adhesion of a film deposited thereon or can improve the substrate morphology in another manner to improve processing thereof.

According to embodiment described herein, an apparatus for coating a thin film on a substrate is provided. The apparatus includes a substrate support e.g., the coating drum 110 having an outer surface for guiding the substrate through a first vacuum processing region and at least one second vacuum processing region, a gas separation unit for separating the first vacuum processing region and at least one second vacuum processing region and adapted to form a slit through which the substrate can pass between the outer surface of the substrate support and the gas separation unit, wherein the gas separation unit is adapted to control fluid communication between the first processing region and the second processing region, and wherein the fluid communication is controlled by adjusting the position, e.g. the radial position, of the gas separation unit.

According to different embodiments, which can be combined with other embodiments described herein, an actuator of a gas separation unit 120 for providing the radial position can be selected from the group consisting of: an electrical motor, a pneumatic actuator such as a pneumatic cylinder, a linear drive, a hydraulic actuator such as an hydraulic cylinder, and a support, which has a predetermined thermal expansion coefficient when being exposed to predetermined heating or cooling. For example the gas separation unit or the gas separation unit together with the processing station 130 can have a support which is connected to the coating drum 110 or the axis of the coating drum 111. This can be a disc mounted stationary on the axis or the like. The thermal expansion of the support can, thus, be provided with a similar or comparable behavior as the coating drum itself.

In light of the above, the slit width of the gas separation unit can be adjusted while the chamber 102 is closed and while the apparatus 100 is under operation. Accordingly, variations in the slit width, for example, due to thermal expansion of the substrate support, e.g. the coating drum 110, can be compensated for and the slit width of the gas separation unit can be adjusted to individual operation conditions.

This can be particularly useful in applications for which a high gas separation is required, e.g. PECVD processes. Accordingly, the apparatuses described herein, and having compartments for various deposition sources allow for a modular combination of several CVD, PECVD and/or PVD processes in a single deposition apparatus, e.g. a R2R coater. The modular concept, wherein all kinds of deposition sources including those which require very good gas separation, can be used in a deposition apparatus according to embodiments described herein, helps to bring down costs for the deposition of complex layer stacks that have to be deposited applying different deposition technologies or intricate combinations of process parameters.

Generally, according to different embodiments, which can be combined with other embodiments described herein, the plasma deposition source can be adapted for depositing a thin film on a flexible substrate, e.g., a web or a foil, a glass substrate or silicon substrate. Typically, the plasma deposition source can be adapted for and can be used for depositing a thin film on a flexible substrate, e.g., to form a flexible TFT, a touch screen device component, or a flexible PV module.

Further embodiments, as described herein, can be beneficial with respect to the following aspect: many process runs need low coating drum temperatures around 0° C. At low temperatures a fixed slit width of the gas separation unit 120, which has been adjusted for higher coating drum temperatures, is in the order of 1.5 to 2.0 mm if thin plastic film (e.g. 50 microns) is used. In this case the gas separation factor is often below the specified gas separation factor (1:100) for the machine. This is critical for process runs where layer materials are deposited with different reactive gas compositions in neighboring processing regions, e.g. sputter chambers. Where such conditions might apply is, for example, during deposition of $Nb_2O_5$ and ITO. This can be the case, for example, for touch panel manufacturing. Accordingly, the embodiments described herein can be used, in particular, for such an application of manufacturing such devices.

Embodiments described herein, provide for some embodiments a modified gas separation unit in deposition systems and particularly in R2R sputter coaters. The position of the gas separation unit can be adjusted, e.g. by an electrical motor or by an alternative mechanical device. The actuator for adjusting and/or varying the position of the element of the gas separation unit, which defines the width of the slit, can be remotely controlled. This can be a controller or a control interface, which is provided outside of the machine chamber. If a sensor unit is provided for measuring the distance between coating drum and the gas separation unit, the adjustment of the slit width can be automated. Accordingly, an improved or optimized gas separation factor can always be provided. This can also prevent the risk of scratching the coating drum when the temperature of the coating drum is increased. An improved gas separation factor can also have an impact on the design of the coating machine. The length of the gas separating units between two compartments can be reduced, i.e. the length of the slit and/or of the element 124 shown e.g. in FIGS. 1 and 2, can be reduced. This has an impact which reduces length, costs and footprint of the machine.

According to yet further embodiments for operating and using deposition apparatuses as described herein, deposition of layers or a stack of layers for ultra high barrier stacks or flexible TFT devices can be provided. Ultra high barrier stacks or flexible TFT devices are typically composed of a series of layers, which are typically deposited with PECVD or PVD processes or combinations thereof. Because of the high demands on the quality of the different films it is common use to deposit the single films in specially designed systems for each single film. To bring down costs and make the applications commercially available, it is an improvement to combine the deposition of at least sets or combinations of films in one single coater. According to embodiments described herein, a modular concept which allows the combination of several process modules is provided. Thereby, according to embodiments described herein, the gas or process separation can be realized over a combination of one or more different techniques, which allow for a gas separation with a separation factor being significantly higher as compared to prior systems, and particularly even for variations of different processes being conducted on the same apparatus. In light of the above, according to some embodiments described herein, flexible ultra high barriers for OLED display and/or lighting, flex solar, or other electronic devices with the need for protection from an adjacent environment can be provided. For example, this can include the deposition of etch stop, gate dielectric, channel, source gate and drain electrodes for flexible TFT.

According to some embodiments, the support for supporting the processing station and/or a gas separation unit can be a disc, a portion of a disc, both of which attached fixedly with respect to the axis 111 of the coating drum 110. According to some implementations, the disc can be passively heated or passively cooled by the coating drum 110. Thereby, the disc can be provided at a temperature which is essentially the same as the temperature of the coating drum 110 for example, the temperature of the disc can vary from the temperature of the coating drum 110 by +/−10° C. Accordingly, the disc also experiences the thermal expansion such that thermal expansion of the coating drum 110 is followed by the thermal expansion of the disc or the portion of the disc.

According to yet further embodiments, which can be combined with other embodiments described herein, additionally or alternatively, the disc or a similar support for the gas separation unit 120 or the processing station can be provided with cooling channels or heating elements. Thereby, the temperature of the disc can be individually controlled. Accordingly the thermal expansion of the disc can be controlled independently of the temperature of the coating drum. Thereby, the width of the slit of the gas separation unit and/or alternatively between the coating drum and an electrode of a PECVD source, which will be described in more detail below, can be adjusted.

With respect to the temperature of the coating drum or processing drum the following aspects can be considered.

$$l = l_0 \cdot (1 + \alpha + \vartheta)$$

$$l_0 = \text{length at } \vartheta = 0° \text{ C.}$$

$$\vartheta_{disk} = \frac{\alpha_{drum}}{\alpha_{disk}} \cdot \vartheta_{drum}$$

With a thermal expansion coefficient of stainless steel $\alpha(ss)=0.000016$ K$^{-1}$ and of aluminum $\alpha(Al)=0.0000238$ K$^{-1}$, $\alpha(drum)/\alpha(disk)=0.6723$ can be obtained. Thereby, for example, a disk temperature of 268.91° C. can be provided to correspond to a drum temperature of 400° C. and to compensate for the thermal expansion of the drum at 400° C.

For some embodiments, when the disc consists of a material which has the same thermal expansion coefficient as the coating drum 110 or consists of the same material as the coating drum 110, and if the temperature of the disc can be controlled to be essentially the same as the temperature of the coating drum 110, then the thermal expansion is essentially the same. Thus, the width of the slit varies only by the thermal expansion of a length corresponding to the slit width. According to typical embodiments, the diameter of the coating drum can be 800 mm or above. For example, the diameter can be 1200 mm or above, such as 1600 mm, or even 2000 mm or larger.

According to yet further embodiments, which can be combined with other embodiments described herein, the material of the disc can be selected to be different than the material of the coating drum and can be selected to have a different thermal expansion coefficient as compared to the coating drum. Thereby, the thermal expansion of the disc, which corresponds to thermal expansion of the coating drum 110, can be provided by different temperatures, such that there is no necessity to provide the same temperature at the disc as compared to the coating drum 110. Generally, as mentioned above, it is possible to adjust the width of the slit by regulating or adapting the temperature of the disc independent of the radial dimension of the disc or the material it is made from.

According to yet further embodiments, process parameters such as the distance of the gas separation unit 120 and/or the processing station 130 from the coating drum can be monitored. For example, a monitoring device can be a device measuring the electrode voltage, electrode current, and plasma impedance at the deposition source, e.g. after the match circuit. Additionally or alternatively, also the gas flow into the processing region of the deposition source and out of the processing region of the deposition source can be monitored. For example the pressures at the respective conduits and/or even the gas mixture could be analyzed. If the width of the slits increases, the gas separation factor decreases and process gases of the adjacent processing regions can enter thereby changing the gas pressure and the gas mixture and, thus, the plasma conditions vary. The monitoring device, such as a monitoring device measuring the electrode voltage, electrode current, and plasma impedance measured at the deposition source can be utilized for determining the plasma conditions. In light of the fact that the plasma conditions vary if the diameter of the coating drum 110 increases, for example, due to thermal expansion, a plasma monitor can be utilized for determining the slit width of between the source and the coating drum, i.e. the substrate support, and thereby, also the slit width of one or more of the gas separation units.

According to some embodiments, which can be combined with other embodiments described herein, the monitoring device can be a CVD process monitor. For example, the monitoring device can measure at least one of the group consisting of: the voltage, the current, the phase, the harmonics, the impedance or, by using an algorithm, the plasma density, of the deposition source. Corresponding plasma monitoring devices can be used for endpoint detection of cleaning processes, notification of silane dust formation, and for real-time non-invasive process feedback, e.g. in the form of plasma density for system controlled algorithm. However, according to some embodiments described herein, additionally the monitoring device can be utilized for determining the distance of an electrode of the PECVD source from the substrate and/or the corresponding counter electrode provided behind the substrate, for example the coating drum. Yet, further process gas variations due to a varying slit width of the gas separation device can also be measured with the monitoring device.

Accordingly, a non-invasive plasma characterization method can be provided by an impedance sensor measurement. According to different embodiments, the impedance sensor can be used either as a pre-match or a post-match sensor, i.e. for the match circuit or after the match circuit. Thereby, a post-match mounting of the monitoring sensor provides direct information on RF voltages on the electrodes and the actual plasma impedance. Typically, an electronic "fingerprint" of the plasma can be provided, wherein also the distance of the electrode from the substrate or process gas contamination from adjacent regions can be determined. The differences in phase angle and/or harmonic signal amplitude can show subtle changes in process conditions, for example onset of process drifts. Accordingly, indirect information on ion flux incident at powered electrode surfaces and, hence, plasma density can be provided, particularly by measurement of the harmonics in the system of powering the deposition source.

According to some embodiments, which can be combined with other embodiments described herein, the processing station can include a plasma enhanced chemical vapor deposition (PECVD) source. The plasma enhanced deposition sources can be operated at a frequency of 2 MHz to 90 MHz, for example a frequency of 40.68 MHz, and an integrated impedance sensor can provide for real time in-line process monitoring and control of respective process parameters, for example, the width of the slit of the gas separation unit and/or the distance of the electrode of the deposition source from the substrate.

Figure 2:
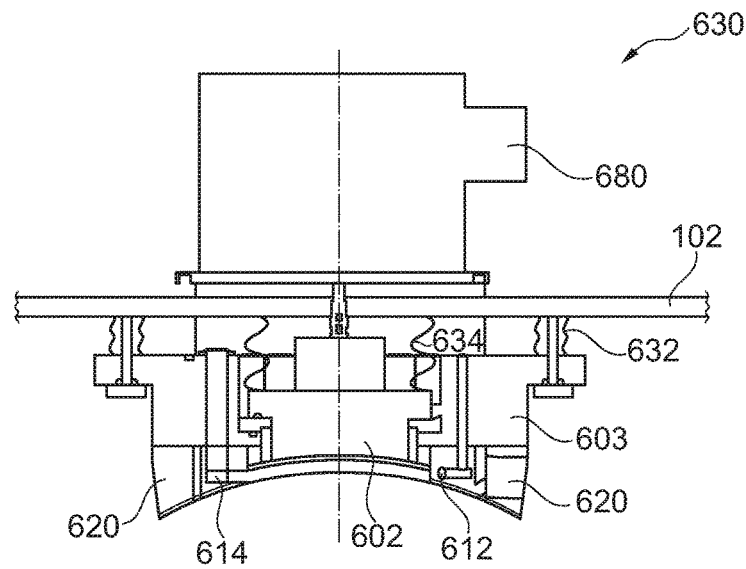
FIG. 2 shows a schematic view of a deposition source as used in roll-to-toll deposition systems and apparatuses according to embodiments described herein.

FIG. 2 shows a deposition source 630 and is used to describe yet further embodiments of deposition sources according to embodiments described herein. For example, the deposition source 630 shown in FIG. 2 can be one of the two processing stations 130 as shown in FIG. 1. The deposition source 630 includes a main body 603. An electrode 602 is supported by the main body. The electrode 602 is connected to the match circuit 680 for plasma generation in the processing regions of the deposition source 630. Thereby, a plasma can be generated during operation between the electrode 602 and the substrate. The deposition source further includes a gas inlet 612 for providing a processing gas mixture into the processing region and an evacuation outlet 614 for removing the processing gas mixture from the processing region. Accordingly the processing gas flows from inlet 612 to outlet 614. FIG. 2 shows a schematic cross-sectional view of a deposition source 630. Typically, the processing gas inlet and processing gas outlet can extend in the direction perpendicular to the paper plane of FIG. 2. Thereby, a plurality of openings or a slit opening can be provided. Typically, the processing gas inlet and outlet is provided to extend at least along the width of the substrate to be processed and/or at least along the desired length of the processing region. Typically, the inlet and outlet will extend at least slightly beyond the maximum substrate width in order to provide uniform conditions in the area to be coated.

According to some embodiments, which can be combined with other embodiments described herein, the deposition source and the gas separation units can be formed as one arrangement. For example, FIG. 2 shows the separation gas unit 620 mounted to the body 603 of the deposition source. Thereby, an adjustment of the slit width of the gas separation unit and an adjustment of the distance between the electrode 602 and the substrate can be provided in a combined manner.

As shown in FIG. 2, the deposition source can be connected to the wall portion 102 such that the distance of the body 603 and the wall 102 can vary. This is indicated by bellows 632 and 634. Accordingly, the main body 603, the electrode 602, and/or the gas separation unit 620 can be supported with a support being in mechanical contact with the axis of the coating drum. Thereby, the slit width of the gas separation unit as well as the distance between the electrode 602 and the substrate can be adjusted. Yet further, alternatively, an actuator can be provided between the main body 603 of the deposition source 630 and the wall 102 such that the position of the main body, and, thereby, of the gas separation unit and the electrode, can be varied for adjustment of the distance to the substrate.

Figure 3:
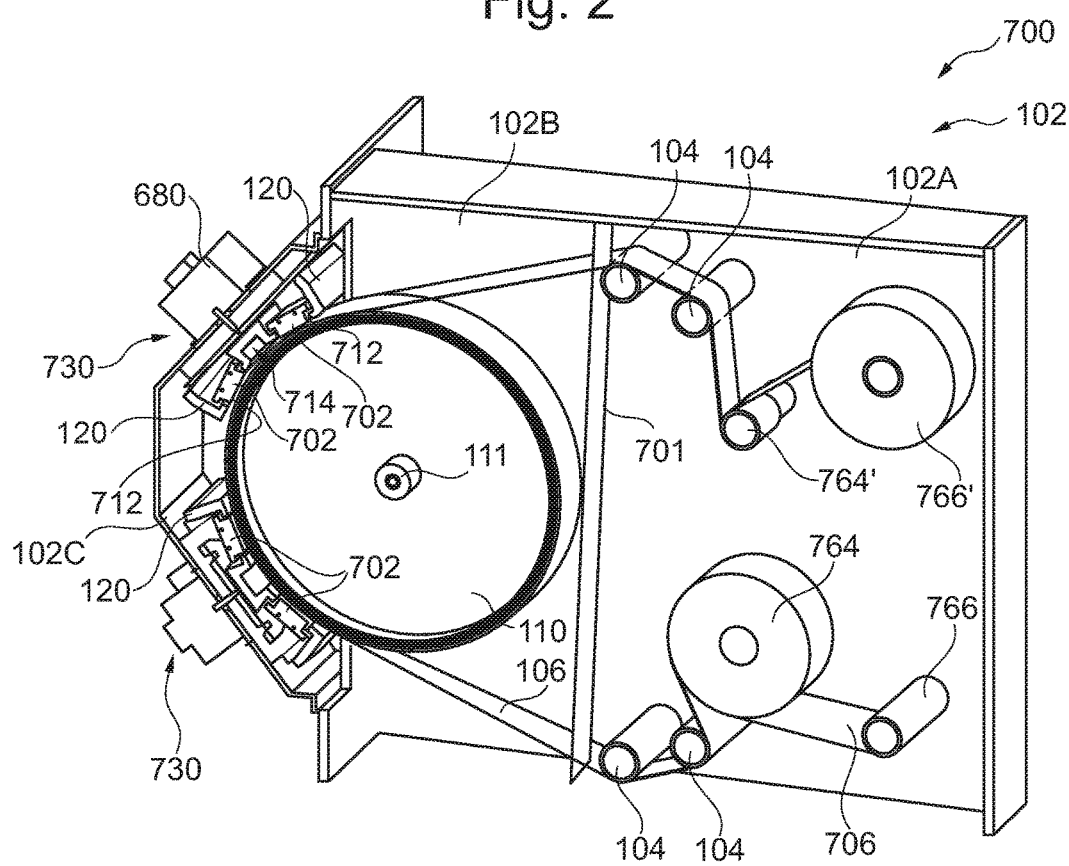
FIG. 3 shows a schematic view of a further roll-to-roll deposition apparatus for depositing or coating the thin-film on a flexible substrate according to embodiments described herein.

FIG. 3 shows a further deposition apparatus 700. The flexible substrate 106 is provided on a first roll 764, e.g. having a winding shaft. According to some embodiments, which can be combined with other embodiments described herein, the flexible substrate to be processed can be provided on the roll 764 together with an interleaf 706. Thereby, the interleaf can be provided between adjacent layers of the flexible substrate such that direct contact of one layer of the flexible substrate with an adjacent layer of the flexible substrate on roll 764 can be omitted. The flexible substrate 106 is unwound from the roll 764 as indicated by the substrate movement direction shown by arrow 108. Upon unwinding of the flexible substrate 106 from the roll 764 the interleaf 706 is wound on the interleaf roll 766.

A separation wall 701 is provided for separation a first chamber portion and a second chamber portion. As described with respect to FIG. 1, the separation wall is further provided with gap sluices for having the substrate pass therethrough.

The substrate 106 is then moved through the deposition areas provided at the coating drum 110 and corresponding to positions of the deposition sources 730. During operation, the coating drum 110 rotates around axis 111 such that the substrate moves in direction of arrow 108. According to typical embodiments, the substrate is guided via one, two or more rollers 104 from the roll 764 to the coating drum and from the coating drum to the second roll 764', e.g. having a winding shaft, on which the substrate is wound after processing thereof. After processing, a further interleaf can be provided from interleaf roll 766' between the layers of the flexible substrate 106, which is wound on to the roll 764'.

The substrate 106 is coated with one or more thin films, i.e. one or more layers are deposited on the substrate 106 by deposition sources 730. The deposition takes place while the substrate is guided on the coating drum 110. The deposition sources 730, shown in FIG. 3, and which can be provided in embodiments described herein, include two electrodes 702, which are electrically connected to match circuit 680 for providing power to the electrodes. The deposition source 730 according to some embodiments described herein, can include two gas inlets 712 at the opposing sides of the deposition source and a gas outlet 714 between the two electrodes 702. Accordingly, a gas flow of processing gas can be provided from the outer portions of that deposition source 730 to the inner portion of that deposition source. As shown in FIG. 3 and according to some embodiments described herein, the substrate transport direction 108 is parallel to a gas flow direction.

According to different embodiments, which can be combined with other embodiments described herein, the gas inlets or gas outlets may be provided as gas lances, gas channels, gas ducts, gas passages, gas tubes, conduits, etc. Furthermore, a gas outlet may be configured as a part of a pump which extracts gas from the plasma volume.

Gas separation units 120 are provided on at least one, typically both sides of the deposition source. Thereby, the slit width of the gas separation units, i.e. the distance between elements of the gas separation unit, and the substrate can be adjusted according to any of the embodiments described herein. Additionally, also the distance of the electrode 702 with respect to the substrate can be adjusted. Thereby, the support of the gas separation unit and, optionally the deposition source having the electrode therein, can be provided for adjustment of the distance to the substrate.

As shown in FIG. 3, and in accordance with embodiments described herein, a plasma deposition source 730 can be provided as a PECVD (plasma-enhanced chemical vapor deposition) source having a multi-region electrode device including two, three or even more RF electrodes 702 arranged opposite to a moving substrate.

The individual electrodes 702 each have an electrode width and an electrode length, wherein the electrode width is measured in a direction parallel to the substrate transport direction 108 and wherein the electrode length is measured in a direction perpendicular to the substrate transport direction 108 of the moving substrate 106.

The electrode area corresponds to a plasma region such that the plasma regions of the at least two electrodes 702 form a combined plasma region, which is located in one vacuum processing region. The electrode width may be determined on the basis of plasma parameters such as deposition gas flow, plasma pressure, RF power and RF frequency provided at the respective RF electrode, and a deposition gas depletion profile. According to yet further embodiments, multi region plasma deposition sources can also be provided for MF deposition.

The electrode length of an individual electrode 702 may be adjusted such that the electrode length exceeds a lateral dimension of the moving substrate perpendicular to the substrate transport direction. Albeit mainly plasma deposition processes are described in the present disclosure, it is to be understood that the plasma deposition source in accordance with embodiments described herein may also be used for plasma enhanced etching processes, plasma-enhanced surface modification processes, plasma-enhanced surface activation or deactivation processes, and other plasma-enhanced processes known to the skilled person.

It is noted here that the term "gas inlet" denotes a gas supply into a deposition region (a plasma volume or processing region), whereas the term "gas outlet" denotes a gas discharge or evacuation of deposition gas out of a deposition region. The gas inlet 712 and the gas outlet 714, according to a typical embodiment, are arranged essentially perpendicular to the substrate transport direction.

According to some embodiments, which can be combined with other embodiments described herein, the deposition source 730 shown in FIG. 3 can be operated at the frequency of 40.68 MHz. Thereby, efficient power coupling to the plasma electrodes can be achieved and the ion bombardment energies can be reduced, which results in less film damage. This can be particularly useful for sensitive flexible substrates such as foils or the like. The twin-electrode source having electrodes 702 operates without a showerhead and process gases can be introduced from the electrode sides, whereas the pumping of the side of an electrode results in a flow of the processing gas mixture along the moving substrate. According to some embodiments, which can be combined with other embodiments described herein, two electrodes can be driven in parallel with one power supply and one matching network, i.e. matching circuit. It is yet further possible to also provide additional electrodes in order to scale up the deposition source.

Generally, embodiments described herein are particularly useful if different processes, e.g. with different process gases such as $H_2$ and $SiH_4$, are to be conducted in adjacent processing regions or chambers. Thereby, an undesired flow from one processing region to the other processing region and vice versa needs to be avoided. For some of the applications referred to herein and for which embodiments described herein are beneficial, e.g. flexible TFT, flexible PV, etc., a separation factor of 10000 or above needs to be provided, which is not possible with common gas separation units. According to some embodiments, the slit width of a gas separation unit can be varied, as described herein. Additionally or alternatively a purge gas arrangement can be provided. Thereby, the purge gas can also be referred to as a separation gas. A typical example of a purge gas can be H2, a noble gas such as argon, or nitrogen. The purge or separation gas flows in the slits in a direction, which is directed in an opposite direction as the undesired gas flow of processing gases. Thus, according to some embodiments, a gas separation can be provided by an intermediate space or intermediate area between two processing electrodes, wherein an inlet of a purge or separation gas and an evacuation or suction outlet is provided.

According to typical embodiments, which can be combined with other embodiments described herein, if a suction or evacuation duct is included, which is provided between adjacent vacuum processing regions, the pressure in the area where the suction or evacuation duct is provided is lower than in any of the surrounding processing regions. Thereby, it can be avoided that contamination gases from the area of the suction or evacuation duct can enter any of the processing regions. However, this results in a high flow rate of processing gas towards the suction or evacuation duct. Accordingly, the loss of processing gas, and particularly unused processing gas is increased. This, in turn results in an increased CoO.

In order to avoid unnecessary process gas consumption of the deposition apparatuses described herein, one or more intermediate gas inlet areas for inlet of a purge gas are provided. Typically, the one or more intermediate gas inlet areas can be provided such that they surround the processing regions. Typically, the purge gas or separation gas can be hydrogen, or another gas which is used as a processing gas in the processing region. According to typical embodiments, which can be combined with other embodiments described herein, the flow rate of the purge gas is adjusted such that total pressure in the intermediate gas inlet area is only slightly below the pressure in the processing region. Accordingly, a controlled flow of gases out of the processing region can be provided and the loss of gases is limited. Thereby, the typical total pressure in an intermediate gas inlet area is between 50% to 99%, for example 75% to 99%, of the total pressure in the processing region.

Returning to FIG. 2, the deposition source includes an electrode 602. The electrode is connected to a match circuit 680 for providing power to the electrode. Thereby, a plasma can be ignited and maintained in the processing region. The deposition source further includes a gas inlet 612 for providing a processing gas mixture into the processing region and an evacuation outlet 614 for removing the processing gas mixture from the processing region. Accordingly the processing gas flows from inlet 612 to outlet 614. According to typical implementations, a plurality of openings or a slit opening can be provided. Around the processing region provided between the electrode 602 and the substrate, one or more gas separation units 620 can be provided. According to yet further embodiments, which can be combined with other embodiments described herein, one or more separation gas inlets can be provided. Thereby, separation or purge gas is provided in the intermediate gas inlet areas between the separation gas inlets and the gas separation unit 620.

Typically, each deposition source and the corresponding processing region, e.g. a vacuum processing region has its individual corresponding vacuum pump or pumping station for evacuation of the respective area. Further, the chamber portions 102A, 102B and 102C of the housing of the apparatus include common vacuum pumps or pumping stations, i.e. the chamber includes the respective flanges. During operation, this pumping stations or vacuum pumps are used to provide an overall chamber pressure, which is below the lowest pressure in one of the intermediate gas inlet areas. Accordingly, a gas flow from the chamber into an intermediate gas inlet area can be avoided. Yet further, as described above, a gas flow from an intermediate gas inlet area into the processing region can be avoided. Under these boundary conditions, pressures and gas flow rates can be adjusted to provide for the desired gas separation factors.

According to some embodiments described herein, and as shown in FIG. 2, the electrode 602 can be a curved electrode. Thereby, the curved electrode is shaped to have an essentially constant distance from a coating drum for supporting the substrate during processing. The processing regions are provided at different angular positions of the coating drum. According to typical embodiments, the processing drum or coating drum can be configured to be heated and/or cooled to temperatures of 20° C. to 400° C. The temperature differences that can be utilized for different processing applications can result in a thermal expansion of the processing drum. The thermal expansion (positive or negative, i.e. a shrinkage if the drum is cooled from a higher temperature to a lower temperature) can be in the range of several millimeters.

As described herein and according to some embodiments, the at least one of a gas separation unit, an electrodes of a deposition source, or the entire processing station including the deposition source, the gas separation unit and the separation gas inlet are mounted to be movable such that the distance between the substrate support surface and the respective element can be varied. For embodiments with a cylindrical coating drum the respective element can be mounted to be radially movable.

According to different embodiments, which can be combined with other embodiments described herein, the at least one of a gas separation unit and electrodes of a deposition source, or the entire processing station including the depositions source, the gas separation unit and the separation gas inlet can be mounted with a respective bellow. A gas separation is provided between the processing station and the substrate support surface. Accordingly, the substrate support surface extends in the direction perpendicular to the substrate moving direction, at least along the entire length of each processing station including the gas separation units, the intermediate gas inlet areas, the separation gas inlets, and, if present, also further gas separation units around the separation gas inlets (see, e.g. FIG. 6). The variation of the one or more positions of the respective elements to provide for an essentially constant or predetermined distance to the substrate support surface, e.g. the curved surface of a coating drum, can be provided by an actuator or a support as described herein.

Figure 4A:
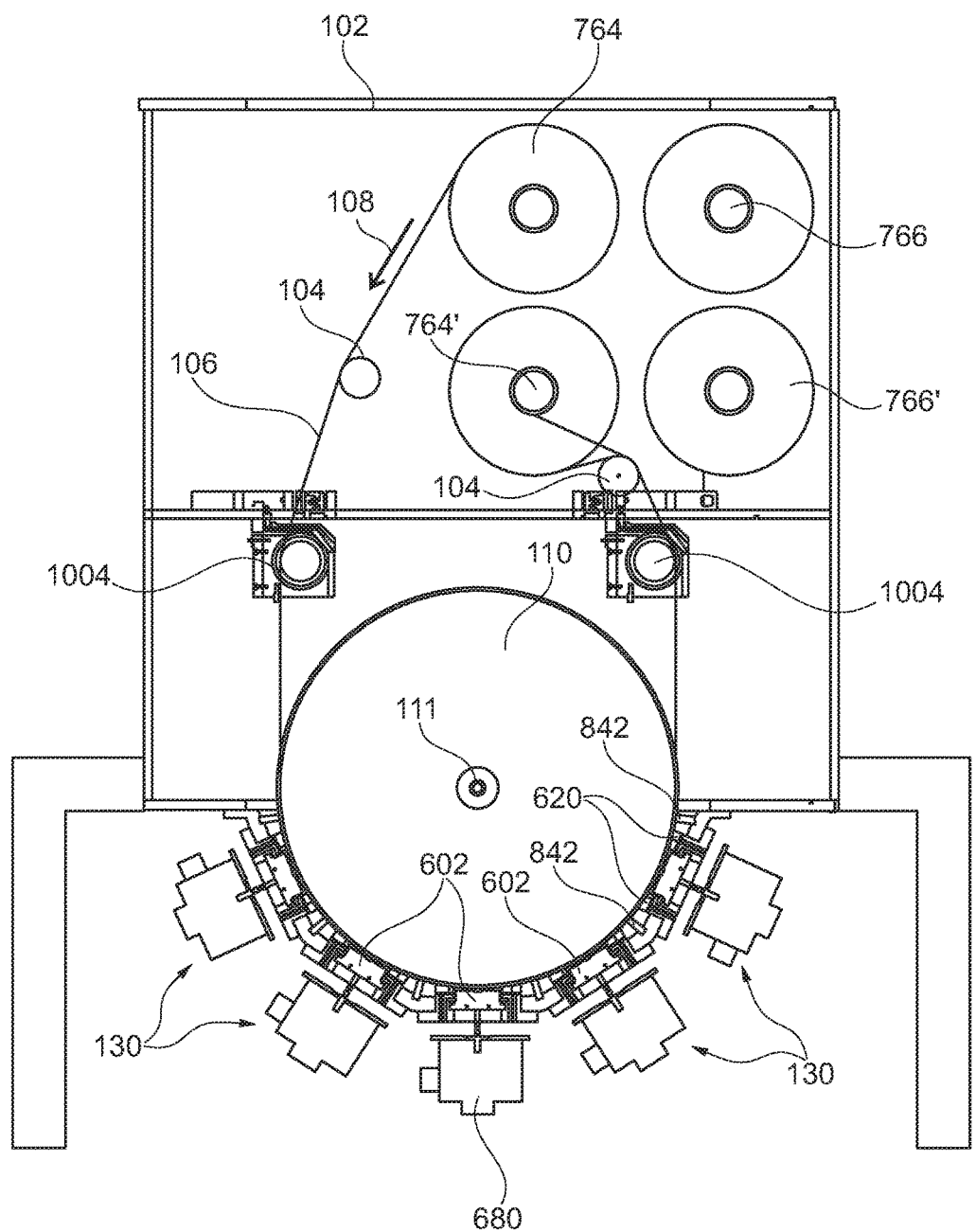
FIGS. 4A and 4B shows a schematic view of a further roll-to-roll deposition apparatus for depositing or coating the thin-film and having a gas separation unit according to embodiments described herein.

FIG. 4A shows a further deposition apparatus 1000. The flexible substrate 106 is provided on a first roll 764. According to some embodiments, which can be combined with other embodiments described herein, the flexible substrate to be processed can be provided on the roll 764 together with an interleaf 706. Thereby, the interleaf can be provided between adjacent layers of the flexible substrate such that direct contact of one layer of the flexible substrate with an adjacent layer of the flexible substrate on roll 764 can be omitted. The flexible substrate 106 is unwound from the roll 764 as indicated by the substrate movement direction shown by arrow 108. Upon unwinding of the flexible substrate 106 from the roll 764 the interleaf 706 is wound on the interleaf roll 766.

The substrate 106 is then moved through the deposition areas provided at the coating drum 110 and corresponding to positions of the deposition sources 130. During operation, the coating drum 110 rotates around axis 111 such that the substrate moves in the direction of arrow 108. According to typical embodiments, the substrate is guided via one, two or more rollers 104 from the roll 764 to the coating drum and from the coating drum to the second roll 764', around which the substrate is wound after processing thereof. After processing, a further interleaf can be provided from interleaf roll 766' between the layers of the flexible substrate 106, which is wound on to the roll 764'.

The substrate 106 is coated with one or more thin films, i.e. one or more layers are deposited on the substrate 106 by deposition sources 130. The deposition takes place while the substrate is guided on the coating drum 110. The deposition sources 130 shown in FIG. 4A, and which can be provided in embodiments described herein, include one electrode 602, which is electrically connected to match circuit 680 for providing power to the electrode. The deposition source 130, according to some embodiments described herein, can include a gas inlet at one side of the deposition source and a gas outlet at the opposing side of the deposition source, i.e. a respective electrode thereof. Accordingly, a gas flow of processing gas can be provided along the electrode over the deposition source. As shown in FIG. 4A, and according to some embodiments described herein, the substrate transport direction 108 is parallel to a gas flow direction. It is noted here that the term "gas inlet" denotes a gas supply into a deposition region (a plasma volume or processing region), whereas the term "gas outlet" denotes a gas discharge or evacuation of deposition gas out of a deposition region. The gas inlet and the gas outlet, according to a typical embodiment, are arranged essentially perpendicular to the substrate transport direction.

According to different embodiments, which can be combined with other embodiments described herein, the gas inlets or gas outlets may be provided as gas lances, gas channels, gas ducts, gas passages, gas tubes, conduits, etc. Furthermore, a gas outlet may be configured as a part of a pump which extracts gas from the plasma volume.

Gas separation units 620 are provided on at least one, typically both sides of the deposition source. Thereby, the slit width of the gas separation units, i.e. the distance between elements and the substrate can be adjusted according to any of the embodiments described herein. Additionally or alternatively, also the distance of the electrode 602 with respect to the substrate can be adjusted. Thereby, the support of the gas separation unit and, optionally the deposition source having the electrode therein, can be provided for adjustment of the distance to the substrate.

As shown in FIG. 4A and according to yet further embodiments, which can be combined with other embodiments described herein, one or more separation gas inlets 842 can be provided. Typically, the separation gas inlets can be provided between neighboring processing regions and/or deposition sources, respectively. Thereby, separation or purge gas is provided in the intermediate gas inlet areas between the separation gas inlets 842 and the gas separation unit 620.

The rollers 104, which guide the substrate 106 from the roll 764 to the roll 764' or vice versa, are configured for tension measurement. According to typical implementations of embodiments described herein, at least one tension measurement roller is provided in the apparatus. Yet, two tension measurement rollers on both sides of the coating drum allow for tension measurement on the winding side and the unwinding side of the coating drum. Typically, the tension measurement roller is configured for measuring the tension of the flexible substrate. Thereby, the substrate transport can be better controlled, the pressure of the substrate on the coating drum can be controlled and/or damage to the substrate can be reduced or avoided. According to yet further embodiments, which can be combined with other embodiments described herein, an additional tension measurement roller or an additional set of tension measurement rollers, i.e. on the winding side and on the unwinding side of the coating drum, can be provided for the interleaf guiding.

According to yet further embodiments, which can be combined with other embodiments described herein, the rollers 104, which are further used to guide the flexible substrate, can have minimum wrapping of 13°, typically of 15° or above. Thereby, minimum wrapping angle relates to the fact that the enlacement varies depending on and between the two operation conditions when the rolls 764 and 764', respectively, are empty or filled entirely with a substrate. According to yet further embodiments, which can be combined with other embodiments described herein, the gap sluices 1004 provide a vacuum-tight kind of valve such that the gas atmosphere of the winding and unwinding region can be separated from that of the processing region of the apparatus while the flexible substrate is fed through it and clamped in it.

As further shown in FIG. 4A, the deposition apparatus is arranged such that the deposition sources are provided at the lower half of the coating drum. In other words, the entire arrangement of all deposition sources or at least the arrangement of the middle three deposition sources is provided below the axis 111 of the coating drum 110. Thereby, generated particles, which could contaminate the substrate and the process, remain in the deposition stations due to gravitation. Thereby, generation of undesired particles on the substrate can be avoided. According to some embodiments, the first chamber portion is essentially above the second chamber portion and the second chamber portion is above the third chamber portion.

Embodiments described herein refer inter alia to deposition apparatus and methods of operation thereof. Thereby, compartments are provided at a chamber or housing where a deposition source can be mounted. According to typical embodiments, which can be combined with other embodiments described herein, two or more compartments are provided. For example, four, five, six, eight or 12 compartments can be provided. The deposition source can be selected from the group consisting of a CVD source, a PECVD source and a PVD source. The concept utilizing compartments allow for exchange of the deposition sources such that the deposition apparatus can be flexibly applied for different applications or different process steps of an application. According to typical implementations, the apparatuses can be used for manufacturing flexible TFT displays, and particularly for barrier layer stacks for flexible TFT displays.

As already described above, the apparatuses and methods according to embodiments described herein can include a plurality of optional features, aspects and details, which might be implemented alternatively or in combination, for example, rolls for winding and unwinding of an interleaf. Accordingly, the methods can include providing an interleaf between layers of substrate on a roll or receiving an interleaf at the unwinding side. Further, the substrate temperature or the temperature of the coating drum can be from 20° C. to 250° C. or even up to 400° C. Typically, the apparatuses are configured for substrate length of 500 m or above, e.g. of 900 m or above, e.g. 1000 m. The substrate width can be 300 mm or above, e.g. 400 mm or above, particularly 1400 mm or above. Typically, the substrate thickness can be 50 µm to 200 µm.

According to embodiments described herein, the third chamber portion 102C has a convex shape wall portion. Thereby, convex is to be understood as either having a curved surface of the wall portion or having a plurality of flat surfaces adjacent to each other in order to provide for a convex shape of the plurality of surfaces. According to typical embodiments, the plurality of flat surfaces forming together the convex shape has the advantage that the below-mentioned vacuum flange connections can be provided at a flat surface, which is easier to manufacture. The easier manufacturing again reduces the costs of the equipment.

According to yet further embodiments the distance of the curved outer surface of the coating drum 110 and the flange or the convex shape of the chamber can be from 10 mm to 500 mm. Thereby, the distance refers to the dimension from the coating drum surface to the inner wall or flange portion, which delimits the vacuum area of the chamber 102. Providing the convex shape and the dimensions mentioned above allow for a reduced chamber volume in the third chamber portion 102C. The reduced chamber volume in the third portion allows for easier gas separation and easier evacuation of processing zones. For example, the second chamber portion has a volume of the evacuatable region and the third chamber portion has a further volume of the further evacuatable region and the ratio of the volume to the further volume is at least 2:1, such as 3:1 to 6:1

According to yet further implementations, areas in the third chamber portion, which are not filled with a solid material can be filled with blocks of materials to reduce the area to be evacuated. For example, the second chamber portion has a volume of the evacuatable region and the third chamber portion has a further volume of the further evacuatable region and the ratio of the volume to the further volume is increased by volume reduction blocks to at least 7:1.

Figure 4B:
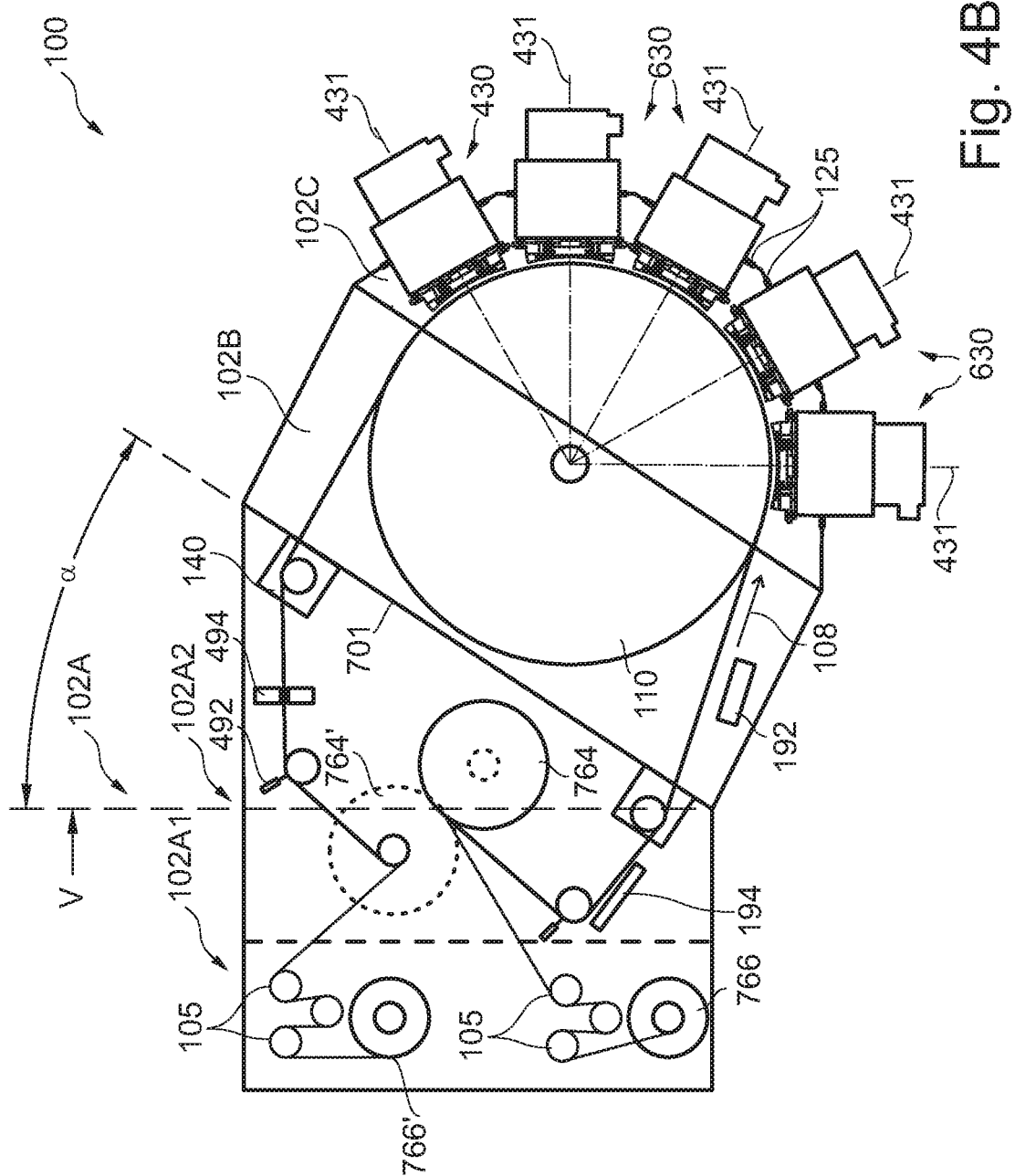

FIG. 4B shows another apparatus for processing a flexible substrate, e.g. for depositing a thin film on the flexible substrate. Thereby, aspects, features, details and elements that are elsewhere discussed herein, in particular with respect to FIGS. 1 to 4, will not be described again. Yet, it is understood that the various embodiments described herein and which relate to elements or features that are shown in FIG. 4B or which might be omitted in FIG. 4B can be combined to yield yet further embodiments. FIG. 4B particularly illustrates as an optional modification of other embodiments described herein that the first chamber portion 102A is separated in an interleaf chamber portion unit 102A1 and a substrate chamber portion unit 102A2 of the first chamber portion. Thereby the interleaf rolls 766/766' and the interleaf rollers 105 can be provided as a modular element of an apparatus. That is the apparatus with the chamber portion unit 102A2 can be provided, operated and manufactured to have an apparatus in the event no interleaf is wished. If an operator wants to have the option to use an interleaf, he can add the interleaf chamber portion unit 102A1, e.g. as an upgrade of the machine or the like, and can use the interleaf as desired. Accordingly, the CoO can be easily and flexibly adapted to the needs of the owner of the apparatus. Further, one interleaf chamber portion unit 102A1 could be used for two or more apparatuses having the chamber elements 102A2, 102B and 102C. Thereby, the chamber portion units 102A1 and 102A2 can be configured to define one vacuum region of the vacuum chamber 102 if both units are present as indicated by the dashed line in FIG. 4B or the chamber portion unit 102A2 alone can define the respective vacuum region if the interleaf module is not present.

FIG. 4B further illustrates as another additional or optional modification that the wall 701 and/or the axis defined by the distance between the gap sluices 140, which are capable of providing a vacuum separation between the first chamber portion 102A and the second chamber portion 102B, are inclined with respect to a vertical V or horizontal orientation. Typically, the angle, of inclination α can be 20° to 70° relative the vertical. Thereby, the inclination is such that the coating drum is displaced downwardly as compare to a horizontal arrangement of the similar components without inclination. The inclination of the wall and/or the axis defined between the gap sluices allows for providing additional processing stations or deposition sources 630 to be provided such that its axis (see lines 431 shown in FIG. 4B), e.g. the symmetry axis of the plasma electrode (e.g. electrode 602 shown in FIG. 2) is on the same height or below the axis of the coating drum 110, As shown in FIG. 4B, the four deposition sources 630 are provided at the height of the rotation axis of the coating drum or below. As described above finking and falling of generated particles on the substrate can thereby, be reduced or omitted. The fifth processing station, which is shown as an etching station 430 in FIG. 4B can, for example, be provided above the rotation axis of the coating drum 430. However, it will be understood that an etching station 430 can also be provided at any of the other positions of the convex wall portion of the chamber portion 102C.

According to yet further embodiments, which can be combined with other embodiments described herein, optionally also an optical measurement unit 494 for evaluating the result of the substrate processing and/or one or more ionization units 492 for adapting the charge on the substrate can be provided.

Figure 5:
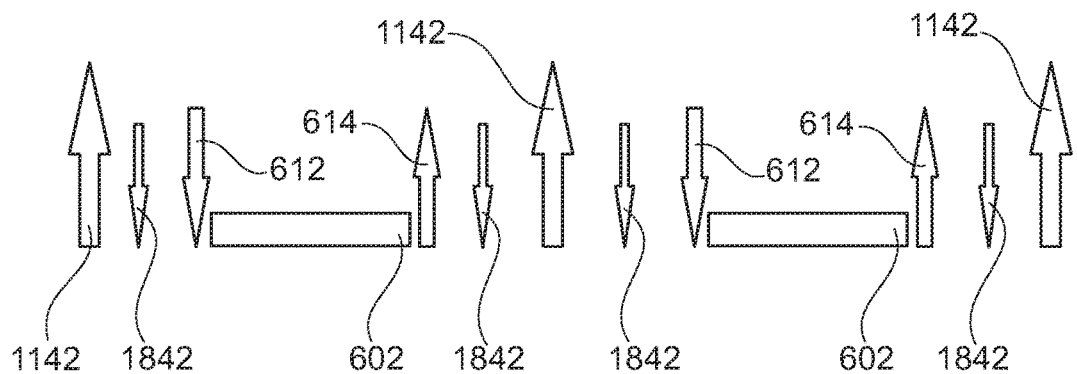
FIG. 5 shows a schematic view of gas separation concepts of a gas separation unit in a roll-to-roll deposition apparatus according to embodiments described herein.

FIG. 5 illustrates the flow of processing gas, the flow of purge or separation gas, and suction or pumping regions according to embodiments described herein. Each of the processing stations shown has an electrode 602. At one side of the electrode a gas inlet 612 is provided. According to typical implementations, the gas inlet can be a slit or a plurality of openings extending in an axial direction of the coating drum 110. Adjacent to the gas inlet 612, a wall portion forming the gas separation unit is provided. Between the deposition stations or the respective processing regions a gas inlet 1842 for a separation gas, such as hydrogen, is provided. Further, pumping or suction channels are provided between the processing stations or the respective processing regions. The vacuum channels 1142, e.g., pumping ports are positioned on both sides of the separation gas inlet 1842 in FIG. 5.

According to some embodiments, which can be combined with other embodiments described herein, the separation gas inlet 1842 can further include a wall portion providing a further gas separation unit. Thereby, the radial position with respect to the axis of the coating drum 110 of the electrode 602, the first gas separation unit 620 and the second gas separation unit can be varied and adjusted. For example the variation and adjustment can be utilized for compensating thermal expansion or shrinkage of the coating drum 110 upon temperature variations of the coating drum.

Some embodiments described herein provide a combination of elements or wall portions of gas separation units, pumping or evacuation ducts, and the separation gas inlets in order to provide for the increased separation factor between adjacent processing areas. As shown in FIG. 5, the separation gas inlet 1842 is provided between the deposition stations and a vacuum channel 1142, e.g. an evacuation duct, is provided on both sides thereof. Thereby, it is to be understood that the processing drum or coating drum 110 extends in a direction perpendicular to the paper plane of FIG. 5. Further, the electrodes and gas inlets, gas outlets and evacuation ducts extend in the direction perpendicular to the paper plane in FIG. 5. Accordingly, the relative position of the elements are described with respect to the substrate transport direction and/or a corresponding cross-section.

FIG. 5 illustrates the schematic concept of various gas inlets and evacuation or suction channels for adjacent deposition sources. FIG. 5 shows two neighboring electrodes 602, which are considered as a portion of a deposition source at the respective position. According to typical embodiments, which can be combined with other embodiments described herein, the electrodes 602 can be electrodes for a plasma assisted deposition process, such as the electrodes of a PECVD source.

As shown in FIG. 5, the gas inlet 612 for processing gas and the gas outlet 614 for processing gas are provided at the opposing sides of the electrode 602 for each of the neighboring deposition sources. Further, separation gas inlets 1842 are provided, wherein a separation gas inlet 1842 is provided at both sides of the electrode 602, such that the gas inlet 612 and the gas outlet 614, respectively, are positioned between the electrode and the respective separation gas inlet. Vacuum channels 1142, i.e. suction channels or evacuation ducts are provided. Thereby the evacuation ducts are provided at the respective opposing sides of the electrode 602 such that the separation gas inlet 1842 and the gas inlet 612 and the gas outlet 614 are provided between the evacuation ducts and the electrode 602.

FIG. 5 shows the electrode 602 and the respective gas inlets and gas outlets as well as the evacuation ducts positioned along a flat surface. The principles of gas separation described herein can be provided for deposition apparatuses, wherein a flat substrate support surface is provided. However, according to other embodiments, a curved substrate support surface, for example the surface of a processing drum or a coating drum can also be provided. It is to be understood that the electrode 602 as well as the gas inlets, gas outlets, and evacuation ducts can then be shaped and/or positioned to correspond to the curved substrate support surface.

FIG. 5 illustrates the gas inlets, the gas outlets, and the evacuation ducts as arrows. It is to be understood, that the respective channels and ducts can be provided according to any of the embodiments described herein.

Embodiments described herein are particularly useful for applications where different processes are provided in adjacent or neighboring deposition stations. For example, the deposition source illustrated by electrode 602 on the left side in FIG. 5 can conduct a first deposition process, wherein the deposition source illustrated by the electrode 602 on the right side of FIG. 5 can conduct a second, different deposition process. If for example the pressure in the left processing region is 0.3 mbar and the pressure in the right processing region is 1.7 mbar, the pressure in the region of the middle vacuum channel 1142, e.g. evacuation ducts, is typically provided to be below the lower pressure of the two processing areas. In the above example, the pressure can be 0.2 mbar. According to yet further embodiments, which can be combined with other embodiments described herein, in the event that more than two deposition sources are provided, the pressure in the regions of the evacuation ducts is provided to be lower than the smallest pressure in any of the processing regions.

According to yet further embodiments, which can be combined with other embodiments described herein, wall portions or elements of gas separation units can be provided for the arrangement described with respect to FIG. 5. Thereby, wall portions or elements of gas separation units can be provided between the process gas inlets and the separation gas inlets as well as the process gas outlets and the separation gas inlets, and can further be provided between the separation gas inlets and the evacuation ducts. This can be better understood and will be described in more detail with respect to FIG. 6 below. According to typical embodiments, which can be combined with other embodiments described herein, at least one of the wall portions and/or at least one of the electrodes can be provided such that the distance from the substrate support surface can be adjusted or varied in order to, for example, compensate for thermal expansions and a corresponding variation of the substrate support surface position. Further, it is to be understood that according to embodiments described herein, which can be combined with other embodiments described herein, at least one of the deposition sources or deposition stations is provided as described for embodiments described herein.

Figure 6:
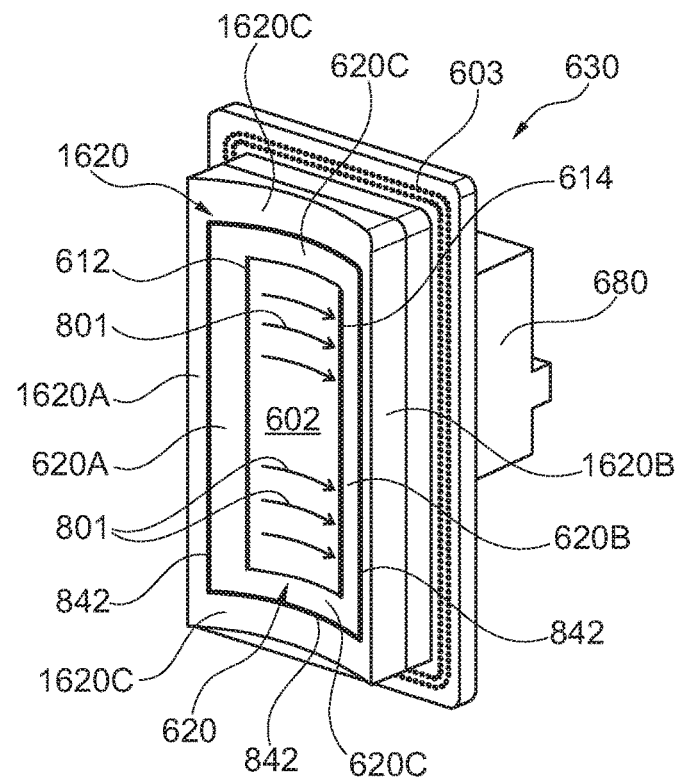
FIG. 6 shows a schematic view of a deposition source according to embodiments described herein for a roll-to-roll deposition apparatus for depositing or coating the thin-film and showing a gas separation unit concept in a three dimensional view.

FIG. 6 shows a deposition station 630. The deposition station 630 includes an electrode 602. The electrode can be connected to match circuit 680 such that the electrode 602 is powered. As shown in FIG. 6, the electrode 602 can be provided with a curved surface, such that the electrode corresponds to a processing drum or coating drum, i.e. has an essentially parallel surface with respect to the surface of the drum. Arrows 801 schematically show a gas flow of processing gas in the processing region along the electrode 602. Respective slits of the process gas inlet 612 and the process gas outlet 614 are highlighted by the lines in FIG. 6. Thereby, according to some implementations, which can be combined with other embodiments described herein, particularly for PECVD processes, the process gas flow is asymmetric, i.e. either in direction of the substrate movement or opposite to the direction of the substrate movement.

Generally, embodiments, which can be combined with other embodiments described herein, can include a substrate support having an outer surface for guiding the substrate along a surface of the substrate support through a first vacuum processing region and at least one second vacuum processing region, a first deposition station corresponding to the first processing region and at least one second deposition source corresponding to the at least one second vacuum processing region, wherein at least the first deposition station includes: an electrode having a surface, wherein the surface of the electrode opposes the surface of the substrate support, a processing gas inlet and a processing gas outlet, wherein the processing gas inlet and the processing gas outlet are arranged at opposing sides of the surface of the electrode, a first separation wall surround the surface of the electrode and the processing gas inlet and processing gas outlet, at least one separation gas inlet surrounding the first separation wall; and at least a second separation wall surround the at least one separation gas inlet. The apparatus for deposition further includes one or more vacuum flanges providing at least a further gas outlet between the first deposition station and the at least one second deposition source.

A gas separation unit 620 is provided around the electrode 602. Thereby, the gas separation unit 620 has a first portion 620A on one side of the electrode 602 and a second portion 620B on an opposing side of the electrode 602. Further side portions 620C of the gas separation unit 620 are provided. According to alternative embodiments, separate gas separation units can be provided such that the first portion 620A and the second portion 620B are each formed by a separate gas separation unit. However, the gas separation unit 620 surrounding the electrode 602 provides for an improved separation factor. Thereby, it is to be understood that according to some passages of the specification and the claims, reference is made to a gas separation unit being provided on one side of the electrode 602 and on an opposing side of the electrode 602. It can be understood with respect to FIG. 6 that one single gas separation unit surrounding the electrode 602 can be provided such that it is provided on two opposing sides of the same electrode.

One or more openings of a separation gas inlet 842 are provided at the first side of the electrode 602 and an opposing side of the electrode 602. The separation gas inlet 842 surrounding the electrode 602 is indicated by the dashed line in FIG. 6. Typically, the separation gas inlet 842 is provided at the opposing sides of the electrode 602, or is provided to evenly surround the electrode 602 such that the gas separation unit 620 is between the separation gas inlet 842 and the electrode.

According to yet further embodiments, which can be combined with other embodiments described herein, a further gas separation unit 1620 can be provided. Thereby, a first portion 1620A and a second portion 1620B can be provided at the opposing sides of the electrode 602. Alternatively, two gas separation units can be provided instead of the first and second portions of the further gas separation unit 1620 shown in FIG. 6. The further gas separation unit 1620 shown in FIG. 6 further has side portions 1620C such that the further gas separation unit 1620 surrounds the electrode 602, the first gas separation unit 620 and the separation gas inlet 842.

As shown in FIG. 6, the elements of the deposition station 630, which are described above, are mounted to the main body 603 of a deposition source or deposition station. The main body can have a frame portion, which can be mounted to the chamber of a deposition apparatus and/or which can be provided in the respective compartment of a deposition apparatus according to embodiments described herein. Thereby, a vacuum region outside of, i.e. surrounding, the further gas separation unit 1620 is provided. This vacuum region is evacuated by evacuation ducts, which correspond to evacuation ducts 1142, as, for example, shown in FIG. 5.

According to different embodiments, which can be combined with other embodiments described herein, at least one of the elements selected from the group consisting of: the gas separation unit 620, the further gas separation unit 1620, and the electrode can be supported and/or connected with the main body 603, an actuator, or a support element connected to an axis of a processing drum or a coating drum such that the distance to the substrate support surface can be varied. Thereby, the gas separation can be improved which is strongly dependent on slit width. For example, a thermal expansion of a coating drum, which can be heated and/or cooled to temperatures of −20° C. to 400° C., e.g. 0° C. to 200° C. or −20° C. to 80° C., can be compensated for. Thereby, the varying slit width of the slit valve between the gas separation unit and the drum, which varies depending on the temperature, can be compensated for. According to typical embodiments, which can be combined with other embodiments described herein, a gas separation factor of 1:100 or more, for example for PVD, or even a gas separation factor of 1:10.000 or more such as 1:100.000, for example CVD, can be provided.

According to additional or alternative implementations, an automatic adjustment of the slit width or the position of the gas separation units can be provided. Thereby, a measurement device, such as a camera, a distance sensor, or the like can be utilized. Further, if a thermal expansion is to be compensated for, a variation of the position of the gas separation unit can be provided by a support element for the gas separation unit having a thermal expansion corresponding to the thermal expansion varying position of the substrate support surface. Thereby, it has to be considered that the slit width between a gas separation unit and the substrate support surface should be as small as possible (for best separation factor) without risking to damage, scratch or destroy the substrate. In light of the above, embodiments described herein are particularly useful for deposition processes where different pressures are to be used for different deposition processes, e.g. CVD processes or PECVD processes, in neighboring processing regions and/or different processing gases are used for different deposition processes in neighboring processing regions, particularly if one processing gas is poisonous for the process in the neighboring processing region.

According to yet further embodiments, which can be combined with other embodiments described herein, a chamber or housing of a deposition apparatus can have compartments or openings, wherein deposition sources or deposition stations having deposition sources can be positioned in the openings or compartments to provide a connection with the chamber or housing such that the chamber or housing forms a vacuum tight enclosure, i.e. can be evacuated to a vacuum with a pressure of about 0.2 to 10 mbar or even to a vacuum with a pressure of 1*10-4 to 1*10-2 mbar. Different pressure ranges are to be considered specifically for PVD processes, in the 10-3 mbar-range and CVD in the mbar-range, which are conducted in different pressure regimes. Further, the chamber or housing can be evacuated to a background vacuum with a pressure of 1*10-6 mbar or below. Background pressure means the pressure which is reached by evacuation of the chamber or housing without any inlet of any gases.

Thereby, the deposition apparatus forms a common platform for a variety of processes and PVD processes, such as evaporation or sputtering, or CVD processes, such as a PECVD process, which can be combined while the substrate is moved through two or more processing regions within the deposition apparatus. Particularly, different PECVD processes can be combined and e.g. utilized for TFT or flexible TFT manufacturing, more particularly for ultra high barriers.

According to yet further embodiments, which can be combined with other embodiments described herein, the rollers for winding and unwinding a flexible substrate, the rollers for guiding a substrate, the processing or coating drum, and other elements being in contact with the flexible substrate are positioned and/or arranged in the deposition chamber such that only the back side of the flexible substrate is contacted, i.e. the side which is not processed in the processing regions. According to yet further embodiments, such deposition apparatuses can be provided with bottom-up deposition sources such that particle generation on the substrate is avoided. Thereby, particularly for processing or coating drum applications, bottom-up deposition sources can be understood as deposition sources being arranged below a rotation axis of the coating drum.

As for example shown in FIGS. 1, 3 and 4, the apparatuses include a plurality of guiding rollers for guiding the substrate to and from the coating drum and on the respective unwinding or winding rolls. Typically, the number of guiding rollers is 2 or above and 6 or below. Thereby, according to typical implementations, the sum of the wrapping angles of all the guiding rollers is can be 20° to 360°, for example 60° to 180°. As described above, they are arranged to provide for a substrate guiding system, which contacts the substrate only on the backside thereof, i.e. on the non-processes side.

According to yet further embodiments, which can be combined with other embodiments described herein, the deposition source with one or more respective electrodes, one or more gas separation units, and optionally provided inputs for separation or purge gas, can be provided as a deposition station, which can be placed into and removed from openings or compartments in the housing or chamber of the deposition apparatus as one assembly.

According to yet further embodiments, which can be combined with other embodiments described herein, the insertion of separation or purge gas is typically conducted by inserting a process gas, such as H2, a noble gas such as argon, or nitrogen in the respective regions defined by the separation gas inlets. Thereby, the separation gas inlets can be slit openings provided between gas separation units, i.e. respective wall elements thereof. According to yet further embodiments, which can be combined with other embodiments described herein, the deposition sources, the gas inlet areas, and the gas separation units are surrounded by areas connected to an evacuation or suction duct such that a background vacuum in the chamber can be provided to be at a pressure lower than any of the pressures in any of the deposition sources or at least of at least 50% of the deposition sources. According to typical implementations, this concept can most easily be provided if at least one first vacuum pump or first pumping station is associated with each of the processing regions or deposition stations, respectively, and at least one second vacuum pump or second pumping station is associated with the chamber to control the overall chamber pressure.

According to a yet further embodiment, a method of depositing at least two layers on a substrate with a first deposition source and at least one second deposition source is provided. The method includes guiding the substrate over a substrate support along a surface (see, e.g., step 1602 in FIG. 7), providing a separation gas at least two positions at opposing sides of at least the first deposition source (see, e.g. step 1606 in FIG. 7), providing a process gas and exhausting the process gas between the at least two positions (see, e.g. step 1604 in FIG. 7), and pumping at at least one vacuum outlet between the first deposition source and the at least one second deposition source (see, e.g. step 1608 in FIG. 7). According to typical implementations thereof, the separation gas can be hydrogen, nitrogen or a noble gas; and/or the pressure at the at least one vacuum outlet can be smaller than the pressure in any area of the first deposition source and the at least one second deposition source.

According to yet further embodiment, an apparatus for depositing a thin film on a substrate is provided. The apparatus includes a substrate support having an outer surface for guiding the substrate through a vacuum processing region, a plasma deposition source for depositing the thin film on the substrate in the vacuum processing region, wherein the plasma deposition source comprises an electrode, and an actuator configured for adjusting the distance between the electrode and the outer surface. The apparatus may include one or more of the below aspects, details and features: the substrate support can be a coating drum and the substrate is a flexible substrate; the plasma deposition source can include a support element being mechanically connected to the electrode and to an axis of the coating drum; the support element can be a disk or a portion of a disk, wherein the disk or the portion of the disk has essentially the same diameter as the coating drum or as the coating drum plus width of the vacuum processing region, wherein the disk or the portion of the disk consists of a material different from that of the coating drum having a different thermal expansion coefficient, wherein the disk or the portion of the disk is kept on an adapted temperature level in order to adjust the diameter of the disk or the portion of the disk to that of the coating drum or the support element can be a disk or a portion of a disk, wherein the disk or the portion of the disk has essentially the same diameter as the coating drum or as the coating drum plus the slit width, wherein the disk or the portion of the disk consists of a material, which is the same material as the material of the coating drum, and wherein either the disk is maintained at the same temperature or the disk or the portion of the disk is kept on an adapted temperature level in order to adjust the diameter of the disk or the portion of the disk to that of the coating drum; the apparatus can further include a monitoring device for monitoring the width of the vacuum processing region; particularly wherein the monitoring device can include an optical or electrical monitor for optically or electrically monitoring width of the vacuum processing region; e.g. the monitoring device can be a plasma monitor connected to the plasma deposition sources for monitoring one or more plasma conditions. According to yet further embodiments, which can be combined with other embodiments described herein, the apparatus can further include a gas separation unit for separating the vacuum processing region from a further second vacuum processing region adapted to form a slit through which the substrate can pass between the outer surface of the substrate support and the gas separation unit, wherein the gas separation unit is adapted to control fluid communication between the processing region and the further processing region, wherein the fluid communication is controlled by adjusting the position of the gas separation unit; particularly wherein the at least one gas separation unit comprises an actuator configured to adjust the width of the slit and/or wherein the substrate support is a coating drum and wherein the at least one gas separation unit comprises a support element being mechanically connected to the gas separation unit and to the axis of the coating drum.

While the foregoing is directed to embodiments of the invention, other and further embodiments of the invention may be devised without departing from the basic scope thereof, and the scope thereof is determined by the claims that follow.

The invention claimed is:

1. An apparatus for processing a flexible substrate, comprising:
a vacuum chamber having a first chamber portion, a second chamber portion and a third chamber portion, the first chamber portion and second chamber portion being separated by a wall inclined at an angle relative to a vertical orientation, wherein the angle is at least 20 degrees;
an unwinding shaft for supporting the flexible substrate to be processed and a winding shaft for supporting the flexible substrate after processing, wherein the unwinding shaft and the winding shaft are disposed in the first chamber portion;
a first gap sluice separating the first chamber portion from the second chamber portion at a first position, the first gap sluice configured to open and close to provide a first vacuum seal between the first chamber portion and the second chamber portion at the first position;
a second gap sluice separating the first chamber portion from the second chamber portion at a second position, the second gap sluice configured to open and close to provide a second vacuum seal between the first chamber portion and the second chamber portion at the second position, wherein the first position is spaced apart from the second position in a vertical and horizontal direction;
a coating drum having a first portion disposed in the second chamber portion and a second portion disposed in the third chamber portion, the coating drum having a rotational axis; and
a plurality of processing stations disposed at least partially in the third chamber portion, wherein a majority of the plurality of the processing stations are disposed below the rotational axis of the coating drum.

2. The apparatus of claim 1, wherein the first gap sluice is offset from the second gap sluice by about 20° and about 70° with respect to a vertical orientation.

3. The apparatus of claim 1, wherein the rotational axis of the coating drum is disposed below a rotational axis of the unwinding shaft and a rotational axis of the winding shaft.

4. The apparatus of claim 1, wherein
each processing station comprises a deposition source, and
each processing station is disposed at a vertical location of the rotational axis of the coating drum or below the rotational axis of the coating drum.

5. The apparatus of claim 1, wherein the first gap sluice is configured to close on the flexible substrate to create the first vacuum seal.

6. The apparatus of claim 1, wherein a majority of the second portion of the coating drum is located below the rotational axis of the coating drum.

7. The apparatus of claim 6, wherein at least some of the second portion of the coating drum is located above the rotational axis of the coating drum.

* * * * *